(12) United States Patent
Chen et al.

(10) Patent No.: US 12,339,303 B2
(45) Date of Patent: Jun. 24, 2025

(54) INDUCTANCE DETECTION FOR POWER CONVERTERS

(71) Applicant: TEXAS INSTRUMENTS INCORPORATED, Dallas, TX (US)

(72) Inventors: Rengang Chen, Bethlehem, PA (US); Bo Wang, Easton, PA (US); Evan Reutzel, Center Valley, PA (US); Dattatreya Baragur Suryanarayana, Bangalore (IN); Bhaskar Ramachandran, Bangalore (IN); Preetam Tadeparthy, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 61 days.

(21) Appl. No.: 17/899,110

(22) Filed: Aug. 30, 2022

(65) Prior Publication Data
US 2023/0400490 A1 Dec. 14, 2023

Related U.S. Application Data

(60) Provisional application No. 63/350,095, filed on Jun. 8, 2022.

(51) Int. Cl.
*G01R 27/26* (2006.01)
*H02M 1/00* (2006.01)
(Continued)

(52) U.S. Cl.
CPC ....... *G01R 27/2611* (2013.01); *H02M 1/0009* (2021.05); *H02M 1/08* (2013.01); *H02M 3/1584* (2013.01)

(58) Field of Classification Search
CPC .......... G01R 27/2611; G01R 31/50–71; G01R 31/302; H02M 1/0009; H02M 1/08; H02M 3/1584; H02M 3/156
See application file for complete search history.

(56) References Cited

U.S. PATENT DOCUMENTS 7,768,245 B1 * 8/2010 De Cremoux ........ H02M 3/156
323/225
9,966,855 B2 5/2018 Ragona et al.
(Continued)

OTHER PUBLICATIONS

Texas Instruments, CSD95480RWJ Synchronous Buck NexFET Smart Power Stage; SLPS670—Jun. 2017; 15 pgs.
(Continued)

*Primary Examiner* — Lee E Rodak
*Assistant Examiner* — Demetrius R Pretlow
(74) *Attorney, Agent, or Firm* — Valerie M. Davis; Frank D. Cimino

(57) ABSTRACT

In an example, a circuit includes an emulated current generator configured to provide an emulated current signal responsive to a charge current and a discharge current. The emulated current signal can be representative of an emulated current through an output inductor. A comparator is configured to provide a comparator signal responsive to the emulated current signal and sensed current signal representative of a measure of current through the output inductor. An inductor code counter is configured to adjust an inductor code count value responsive to the comparator signal. A slope of the emulated current signal can be adjusted responsive to the inductor code count value.

24 Claims, 9 Drawing Sheets

(51) Int. Cl.
*H02M 1/08* (2006.01)
*H02M 3/158* (2006.01)

(56) References Cited

U.S. PATENT DOCUMENTS

| | | | |
|---|---|---|---|
| 10,044,267 B1* | 8/2018 | Childs | H02M 3/156 |
| 2006/0061342 A1 | 3/2006 | Bernacchia | |
| 2014/0340065 A1* | 11/2014 | Svorc | H02M 3/1588 |
| | | | 323/284 |
| 2017/0317580 A1* | 11/2017 | Lyles | H02M 1/32 |
| 2018/0175733 A1* | 6/2018 | Hartman | H02M 3/156 |
| 2019/0267972 A1 | 8/2019 | Kikuchi | |
| 2021/0099080 A1 | 4/2021 | Chen | |
| 2021/0328509 A1* | 10/2021 | Tseng | H02M 1/0009 |
| 2021/0328548 A1 | 10/2021 | Nakatani | |

OTHER PUBLICATIONS

Texas Instruments, CSD95495QVM Synchronous Buck NexFET Smart Power Stage—SLPS671A, Jun. 2017 (Revised Jan. 2018); 14 pgs.

Search Report for T101353WO01, dated Sep. 25, 2023.

* cited by examiner

INDUCTANCE DETECTION FOR POWER CONVERTERS

CROSS-REFERENCE TO RELATED APPLICATION

This application claims the benefit of priority to U.S. provisional application No. 63/350,095, filed Jun. 8, 2022, and entitled ADAPTIVE OUTPUT INDUCTANCE DETECTION FOR POWER STAGE WITH INTEGRATED CURRENT SENSE, which is incorporated herein by reference in its entirety.

TECHNICAL FIELD

This description relates to inductance detection for power converters.

BACKGROUND

Power converter circuits, such as switch mode power supplies, can use external inductors having a wide range of inductances. For some power converters, prior knowledge of output inductance is used to configure the power converter for operation. In some circumstances, however, such prior knowledge is not readily available.

SUMMARY

In a described example, a circuit includes an emulated current generator having a current output. A current sensor has a sensor output. A comparator has first and second comparator inputs, and a comparator output. The first comparator input is coupled to the current output, and the second comparator input is coupled to the sensor output. An inductor code counter has a counter input and a counter output, in which the counter input is coupled to the comparator output. A charge circuit has an input coupled to the comparator output, and the charge circuit includes a variable slope resistor having a trim input coupled to the counter output. A discharge circuit has an input coupled to the comparator output, and the discharge circuit includes a variable valley resistor having a trim input coupled to the counter output.

In another described example, a circuit includes an emulated current generator configured to provide an emulated current signal responsive to a charge current and a discharge current respectively charging or discharging a timing capacitor. The emulated current signal can be representative of an emulated current through an output inductor. A comparator is configured to provide a comparator signal responsive to the emulated current signal and sensed current signal, in which the comparator signal is representative of a measure of current through the output inductor. An inductor code counter is configured to adjust an inductor code count value responsive to the comparator signal. A slope of the emulated current signal can be adjusted responsive to the inductor code count value.

In a further described example, a system includes an inductor and a power stage. the power stage includes high-side and low-side switches. The high-side switch is coupled between a voltage supply terminal and a switching output terminal. The low-side switch is coupled between the switching output terminal and a ground terminal, and the inductor is coupled to the switching output terminal. A driver is configured to control the high-side and low-side switches responsive to a pulse-width modulated control signal. The power stage also includes inductance detection circuitry that includes an emulated current generator having a current output. A comparator has first and second comparator inputs, and a comparator output. The first comparator input is coupled to the current output, and the second comparator input is configured to receive a measure of current through the inductor. An inductor code counter has a counter input and a counter output, in which the counter input is coupled to the comparator output. A charge circuit has an input coupled to the comparator output, and the charge circuit includes a variable slope resistor having a trim input coupled to the counter output. A discharge circuit has an input coupled to the comparator output, and the discharge circuit includes a variable resistor valley having a trim input coupled to the counter output.

DETAILED DESCRIPTION

Example embodiments relate to systems and methods for detecting output inductance for power converters. For example, inductance detection circuitry includes a counter configured to provide an inductor code that is adjusted (e.g., incremented or decremented) responsive to a comparison between an emulated current and a sensed inductor current. The emulated current can be generated to simulate inductor current responsive to a charge current and a discharge current. Circuitry is configured to provide the charge current and the discharge current responsive to the inductor code so the charge current and the discharge current provide a measure of the output inductance. Thus, by changing the inductor code responsive to the comparison over a number of cycles, the inductor code can converge to a value representative of an estimate of the output inductance, and the resulting inductor code value can be stored (e.g., in memory).

In an example, the inductance detection circuitry can include additional detection circuitry, which uses the stored inductor code value. The additional detection circuitry is configured to fine tune the charge and discharge currents responsive to a comparison between the emulated and sensed inductor currents over another set of cycles. The inductance detection circuitry can be added to power stage circuitry, such as to configure the power stage circuitry to implement self-regulated (e.g., adaptive) output inductance detection. The approach described herein thus can provide a practical production solution to enable a power stage circuitry to detect output inductance without requiring the addition of a dedicated pin to an integrated circuit die that includes the respective power stage.

Figure 1:
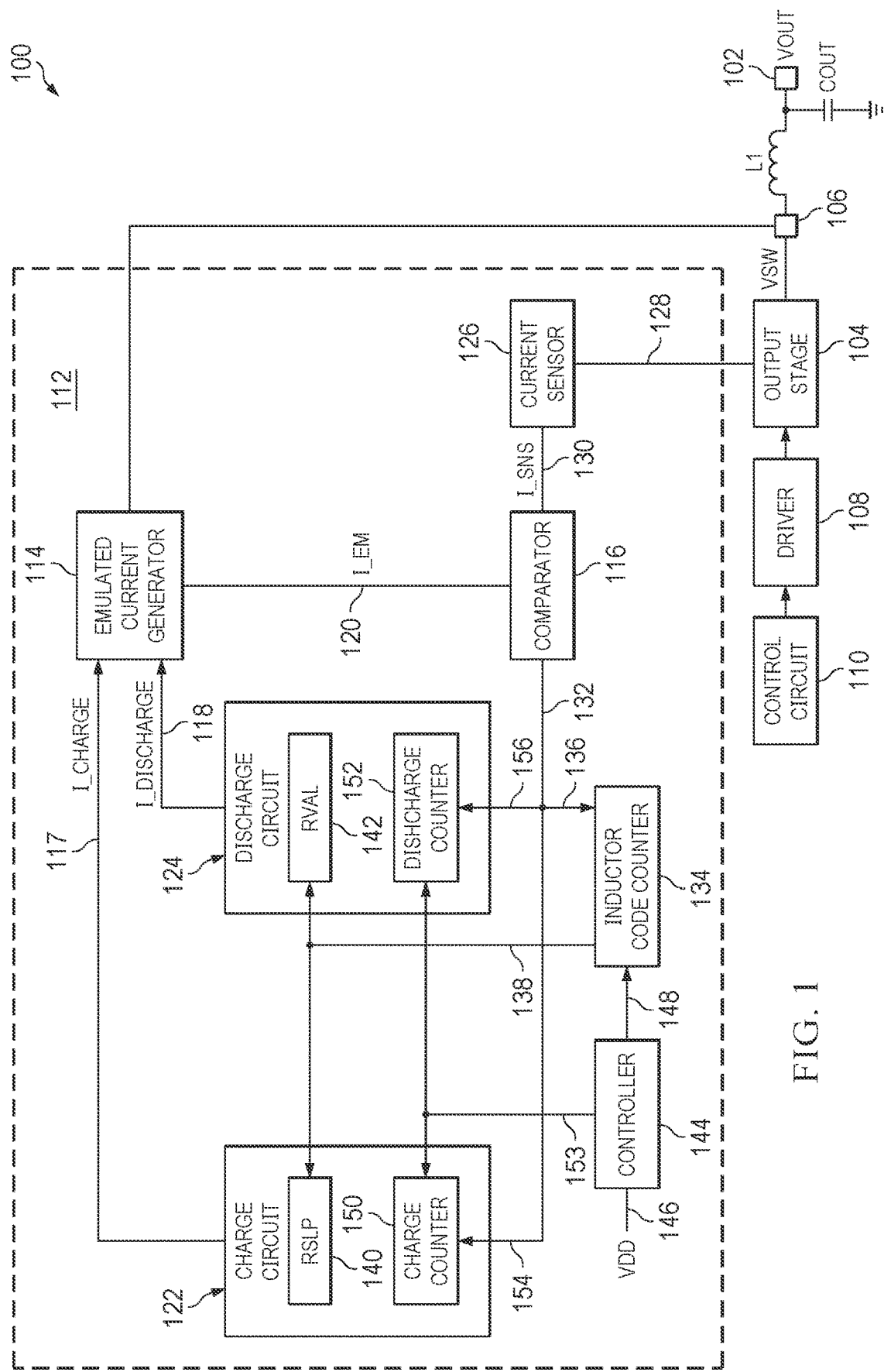
FIG. 1 is a block diagram of an example power converter including inductance detection circuitry.

FIG. 1 depicts a block diagram of a power converter circuit 100 configured to provide a regulated output voltage at an output 102. For example, the power converter circuit 100 can be implemented as a buck regulator, a boost regulator, a buck-boost regulator or other regulator depending on application needs. The power converter circuit 100 also includes an output stage 104 having an output 106 (e.g., a switching output terminal). For example, the output stage 104 is configured to supply a switching voltage VSW at the output 106 responsive to drive signals provided by driver circuitry 108. A control circuit 110 can be configured to implement one or more control loops to generate a control signal (e.g., a pulse-width modulated signal) to command an increase or decrease in output power (e.g., voltage and/or current) at the output 102. The power converter circuit 100 also includes inductance detection circuitry 112 configured to detect inductance of an output inductor L1 coupled between outputs 102 and 106. For example, the inductor L1 is external to an integrated circuit (IC) that includes the power converter circuit 100. An output capacitor COUT can also be coupled to between the output 102 and a ground terminal.

As used herein, the term "circuit" can include a collection of active and/or passive elements that perform a circuit function, such as an analog circuit or control circuit. Additionally or alternatively, for example, the term "circuit" can include an IC where all and/or some of the circuit elements are fabricated on a common substrate (e.g., semiconductor substrate, such as a die or chip). Thus, the power converter circuit 100 or its constituent parts can be implemented on a semiconductor substrate to provide an IC. In one example, a power stage circuit, including the output stage 104, driver 108, control circuit 110 and inductance detection circuitry 112, is implemented in a discrete IC, and the inductor L1 is coupled to output 106 of the IC. In another example, the control circuit 110 is implemented as a separate IC from the IC implementing the power stage circuit.

The inductance detection circuitry 112 includes an emulated current generator 114. The emulated current generator 114 has current inputs 117 and 118 and a current output 120. The current output 120 is coupled to an input of a comparator 116. The current input 117 is coupled to a charge current generator circuit (also referred to as a charge circuit) 122 and the current input 118 is coupled to a discharge current generator circuit (also referred to as a discharge circuit) 124. The emulated current generator 114 is configured to provide an emulated current signal I_EM at current output 120 responsive to a charge current I_CHARGE and a discharge current I_DISCHARGE generated by the respective charge and discharge circuits 122 and 124. The emulated current signal I_EM is representative of a simulated current through an output inductor. As described herein, the inductance detection circuitry 112 is configured to implement self-regulated, closed loop control to adjust a slope of the emulated current I_EM to approximate or match the actual current through the inductor L1.

For example, a current sensor 126 has a sensor input 128 and a sensor output 130. The sensor input 128 is coupled to the output stage 104, and the sensor output is coupled to another input of the comparator 116. The current sensor 126 is configured to provide a sensed current signal I_SNS at sensor output 130 representative of a measure of current through the inductor L1. In an example where the output stage includes high-side and low-side switches, the current sensor 126 can be coupled across a low-side output switch and configured to provide signal I_SNS as measure of inductor current when the low-side switch is turned on and the high-side switch is turned off.

The comparator 116 has a comparator output 132, and is configured to provide a comparator output signal responsive to the emulated current signal I_EM and the sensed current signal I_SNS. In an example, the comparator is implemented as a transconductance amplifier configured to generate a current error signal at 132 responsive to the emulated current signal I_EM and the sensed current signal I_SNS (e.g., where I_EM and I_SNS are currents). In another example, such as where I_EM and I_SNS are provided as voltage signals, the comparator 116 can be implemented as a voltage comparator.

The inductance detection circuitry 112 also includes an inductor code counter 134 having a counter input 136 and a counter output 138. The counter input 136 is coupled to the comparator output 132, and the counter output 138 is coupled to respective inputs of the charge and discharge circuits 122 and 124. The inductor code counter 134 is configured to adjust a count value representative of an inductor code and provide the count value at the counter output 138 responsive to the comparator signal received at 136. The counter 134 thus can increment or decrement the counter value each cycle depending on the relative values of I_EM and I_SNS. For example, if I_EM>I_SNS, the counter 134 can increment the count value (e.g., count up), and if I_EM<I_SNS, the counter can decrement the count value (e.g., count down).

As described herein, the charge and discharge circuits 122 and 124 are configured to adjust a slope of the respective charge and discharge currents I_CHARGE and I_DISCHARGE responsive to the count value (e.g., inductor code count value) at 138. For example, the charge current generator circuit 122 includes a variable resistor 140, shown as slope resistor RSLP, coupled in the path of the charge current I_CHARGE that is being generated. The discharge current generator circuit 124 also includes a variable resistor 142, shown as valley resistor RVAL, coupled in the path of the discharge current I_DISCHARGE that is being generated. The variable resistors 140 and 142 have respective inputs coupled to counter output 138 to receive the inductor code count value and trim the respective resistances accordingly. In one example, each of the variable resistors 140 and 142 are trimmed to the same resistance responsive to the inductor code count value at 138. In another example, the variable resistors 140 and 142 are trimmed to different resistances responsive to the inductor code count value at 138. Thus, the charge and discharge circuits 122 and 124 are configured to adjust the respective charge and discharge currents I_CHARGE and I_DISCHARGE over a number of clock cycles (e.g., PWM cycles) responsive to the inductor code count value at 138 setting the resistance of variable resistors 140 and 142. As a result of adjusting the respective charge and discharge currents, the slope of the emulated current I_EM (e.g., rising and falling slopes of I_EM) are adjusted to converge and match the slope of the sensed inductor current I_SNS.

In some examples, a controller 144 is configured to control inductance detection circuitry 112 for a number of cycles during power-on phase of the power converter 100. For example, the controller 144 has a power input 146 and control output 148. The power input 146 is coupled to a power supply terminal, such as to receive a supply voltage, shown as VDD. The control output 148 can be coupled to an enable input of the inductor code counter 134. For example, responsive to power-up, voltage VDD is supplied at 146 and the controller 144 is configured to provide an enable signal at 148 to enable (e.g., activate) the inductor code counter 134. The controller 144 can be configured to enable the inductor code counter 134 for a number of cycles of a PWM or clock signal. Alternatively, the controller 144 can be configured to enable the inductor code counter 134 for a number of cycles (e.g., a variable number) responsive to detecting dithering between the I_EM and I_SNS signals. For example, the controller 144 can detect dithering responsive to a difference between I_EM and I_SNS remaining less than a dither threshold. Other approaches can be used to detect sufficient convergence between the I_EM and I_SNS signals. The controller 144 can also be configured to store (e.g., latch) the inductor code count value provided by the inductor code counter 134 in memory (e.g., a register). As a result, the values of variable resistors 140 and 142 can be fixed responsive to the stored inductor code count value.

Responsive to the controller 144 detecting convergence of I_EM and I_SNS signals, such as described herein, the controller 144 can be configured to disable the inductor code counter 134 and enable a charge counter 150 and a discharge counter 152 of the respective charge and discharge circuits 122 and 124. For example, the controller 144 also has a control output 153 coupled to enable inputs of the respective charge and discharge counters 150 and 152. The charge counter 150 has an input 154 coupled to the comparator output 132. The discharge counter 152 also has an input 156 coupled to the comparator output 132. When activated responsive to an enable signal provided at 153 by the controller 144, the charge counter 150 and the discharge counter 152 are configured to adjust respective count values responsive to the comparator output at 132. For example, the charge circuit 122 includes a trim circuit configured to set a respective offset voltage for tuning the charge current I_CHARGE responsive to the charge counter output. The discharge circuit 124 can also include a trim circuit configured to set a respective offset voltage for tuning the discharge current I_DISCHARGE responsive to the discharge counter output. While the variable resistors 140 and 142 are fixed responsive to the stored inductor code value, the controller 144 is configured to perform fine tuning of the charge and discharge currents over a number of cycles, which can be a fixed or variable number of cycles. As a result of such fine tuning, the inductance detection circuitry 112 is operable to provide the emulated current I_EM to match the actual inductor current I_SNS to a desired precision.

Figure 2:
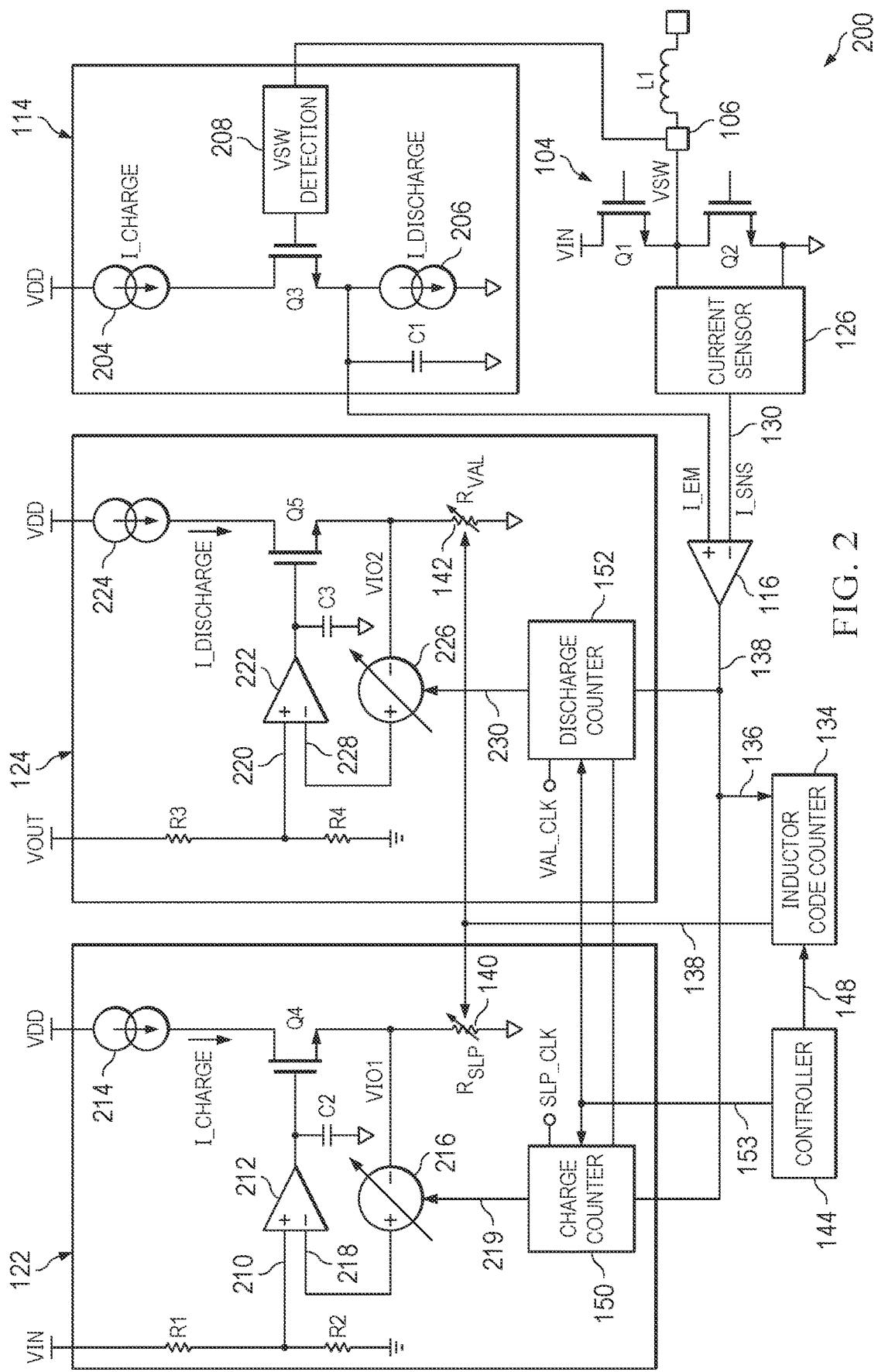
FIG. 2 is a schematic diagram of an example inductance detection circuit.

FIG. 2 illustrates another example of a power converter 200 implementing an inductance detection circuit. The inductance detection circuit 202 can be used to implement the inductance detection circuit 112 of FIG. 1. Accordingly, the description of FIG. 2 also refers to FIG. 1. For example, the circuit 200 includes an output stage 104 having a switching output (e.g., a switching node or terminal) 106 to which an inductor L1 can be coupled. In the example of FIG. 2, the output stage 104 includes field effect transistors (FETs) Q1 and Q2 coupled in series between a supply voltage VIN and ground, in which Q1 is a high-side FET and Q2 is a low-side FET. The source of Q1 is coupled to the drain of Q2, which are also coupled to the switching output 106. A driver circuit (not shown in FIG. 2, but see driver 108 of FIG. 1) is configured to supply gate drive signals to control Q1 and Q2 and provide a switching voltage VSW at 106.

Current sensor 126 has inputs coupled across Q2 and is configured to provide a sensor current signal at 130 representative of a measure of current through inductor L1. For example, the current sensor 126 is configured to measure a low-side output waveform of the low-side FET Q2, such as a voltage (e.g., a drain-to-source voltage) across the low-side FET when Q2 is turned on. The current sensor 126 can be configured to provide the sensor signal I_SNS as a current signal proportional to the inductor output current through L1. Alternatively, the sensor signal I_SNS could be a voltage representative of the inductor output current.

Additionally, as described with respect to FIG. 1, the circuit 200 also includes an inductor code counter 134 having a counter input 136 and a counter output 138. The counter input 136 is coupled to the comparator output 132, and the counter output 138 is coupled to respective inputs of the charge and discharge circuits 122 and 124. The inductor code counter 134 is configured to adjust a count value representative of an inductor code and provide the count value at the counter output 138 responsive to the comparator signal at 136.

FIG. 2 also shows the controller 144 having a control output 148 coupled to an enable input of the inductor code counter 134. The controller 144 is configured to provide a control signal at 148 to enable/disable the inductor code counter 134, and another control signal at 153 to enable/disable the charge and discharge counters 150 and 152 during an inductance detection phase of the circuit 200. For example, the controller 144 is configured to enable the inductor code counter for a first number of cycles of the inductance detection phase to perform a coarse inductance detection while disabling the charge and discharge counters 150 and 152. The controller is also configured to enable the charge and discharge counters 150 and 152 for a second number of cycles subsequently in the inductance detection phase to perform finer inductance detection while disabling the inductor code counter 134.

In the example of FIG. 2, the emulated current generator 114 includes a charge current source 204 and a discharge current source 206. The charge current source 204 is coupled between a voltage supply terminal, shown as providing voltage VDD, and a switch, shown as FET Q3. The charge current source 204 is configured to provide a charge current I_CHARGE (or a current proportional to I_CHARGE) responsive to the current generated by the charge current generator circuit 122. The discharge current source 206 is coupled between Q3 and a ground terminal. The discharge current source 206 is configured to provide a discharge current I_DISCHARGE (or a current proportional to I_DISCHARGE) responsive to the current generated by the discharge current generator circuit 124.

A switching voltage (VSW) detector 208 has an output coupled to a control input (e.g., gate) of Q3. In an example, the VSW detector 208 has an input coupled to the switching output 106, and is configured to control Q3 responsive to the switching voltage VSW at 106. The VSW detector can be implemented as a driver circuit such as is configured to supply a drive signal to turn on the Q3 to conduct when the switching voltage VSW is greater than a threshold voltage and to turn off Q3 when VSW is less than the threshold voltage. A timing capacitor C1 is coupled in parallel with discharge current source 206 between the source of Q3 and ground. The emulated current generator 114 is thus configured to provide the emulated current I_EM responsive to the charge and discharge currents I_CHARGE and I_DISCHARGE and based on the operation of the Q3 (responsive to VSW). For example, I_CHARGE and I_DISCHARGE are configured to respectively charge and discharge the timing capacitor C1 to generate the emulated current I_EM.

FIG. 2 also shows example charge and discharge current generator circuits 122 and 124. For example, charge current generator circuit 122 includes a resistive divider circuit of resistors R1 and R2 coupled between an input voltage (VIN) terminal and ground. An output of the divider (e.g., node between R1 and R2) is coupled to a non-inverting input 210 of an amplifier 212. The divider circuit can be configured to provide a fractional portion of VIN to the amplifier input 210 according to a ratio of resistors R1 and R2. The amplifier 212 has an output coupled to a gate of transistor, shown as FET Q4. A compensation capacitor C2 is coupled between the amplifier output and ground.

A charge current source 214 is coupled between voltage supply terminal VDD and Q4. A variable resistor 140 having a resistance shown as RSLP is coupled between the source of Q4 and ground. As described herein, the resistor 140 has a trim input coupled to the output 138 of the inductor code counter 134. A variable input offset voltage source 216 is coupled between the source of Q4 and the inverting input 218 of amplifier 212. As shown in FIG. 2, the offset voltage source 216 has an input coupled to an output 219 of charge counter 150, and is configured to provide an input offset voltage VIO1 to the input 218 responsive to the charge count value at 219.

In an example, the amplifier 212 is implemented as an operational transconductance amplifier configured to provide an output current responsive to a difference between the voltages at respective inputs 210 and 218. The amplifier 212 thus can provide the output current as a linear function of the differential input voltage at 210 and 218. The charge current source 214 is configured to provide the current I_CHARGE, and I_CHARGE value varies responsive to the resistance RSLP of variable resistor 140. Thus, by adjusting resistance RSLP of variable resistor 140 over a number of cycles, the charge current I_CHARGE changes accordingly. The charge current generator circuit 122 can be configured to provide the charge current I_CHARGE to the emulated current generator 114, such as through one or more current mirrors (not shown). In another example, the charge current generator circuit 122 can be used to implement the charge current source 204 within the emulated current generator 114.

The discharge current generator circuit 124 can be configured to generate the discharge current I_DISCHARGE in a manner similar to the charge current generator circuit 122. The discharge circuit 124 includes a resistive divider circuit of resistors R3 and R4 coupled between an output (VOUT) terminal and ground. An output of the divider (e.g., node between R3 and R4) is coupled to a non-inverting input 220 of an amplifier 222. The divider circuit can be configured to provide a fractional portion of the output voltage VOUT to the amplifier input 220 according to a ratio of resistors R3 and R4. The amplifier 222 has an output coupled to a gate of transistor, shown as FET Q5. A compensation capacitor C3 is coupled between the amplifier output and ground.

A charge current source 224 is coupled between voltage supply terminal VDD and Q5. A variable resistor 142 having a resistance, shown as RVAL, is coupled between the source of Q5 and ground. As described herein, the resistor 142 has a trim input coupled to the output 138 of the inductor code counter 134 so RVAL varies responsive to the count value at 138. A variable input offset voltage source 226 is coupled between the source of Q5 and the inverting input 228 of amplifier 222. The offset voltage source 226 has an input coupled to an output 230 of discharge counter 152. The offset voltage source 226 is configured to provide an input offset voltage VIO2 to the input 228 responsive to the discharge count value at 230. The amplifier 222 can be implemented as an operational transconductance amplifier configured to provide an output current responsive to a difference between the voltages at respective inputs 220 and 228. The charge current source 224 can be configured to provide the current I_DISCHARGE that varies responsive to the resistance RVAL. Thus, by adjusting resistance RVAL of variable resistor 140 over a number of cycles, the value of the charge current I_DISCHARGE changes accordingly.

As described herein, during a first number of cycles at power-on, the inductor code counter 134 is configured to adjust a count value (e.g., representative of the inductor code) from a starting value responsive to the comparator output signal at 138. The starting value can be set to an initial value, such as at or near a middle count value between minimum and maximum count values. The count value at 138 is used to set the resistance RSLP of resistor 140 and the resistance RVAL of resistor 142 (e.g., by pin strapping). The resistance values of RSLP and RVAL can be set to the same or different resistance responsive to the count value at 138. As described herein, the values of the charge current I_CHARGE and discharge current I_DISCHARGE change responsive to respective changes in RSLP and RVAL. While the inductor code counter 134 is enabled (e.g., by controller) during the first number of cycles, the charge counter 150 and discharge counter 152 can be disabled so VIO1 and VIO2 remain constant during this phase. Thus, the inductance detection circuitry 112 can implement coarse tuning of charge and discharge currents I_CHARGE and I_DISCHARGE and the emulated current I_EM signal slopes over a first phase of the inductance detection process. The first inductance detection phase can be set to a number cycles (e.g., a number of PWM cycles or a period of time), which may be programmable. Additionally, or alternatively, the controller 144 can implement the first inductance detection phase until detecting convergence between I_EM and I_SNS, such as described herein. The count value at 138 at the end of the first inductance detection phase can be stored in memory and the controller can disable the inductor code counter 134.

After the first phase of the inductance detection process has completed, the inductance detection circuitry 112 can implement a second phase of the inductance detection process. For example, the inductance detection circuitry 112 can perform finer tuning of charge and discharge currents I_CHARGE and I_DISCHARGE over a second number of cycles that defines the second inductance detection phase. For example, the controller can provide a control signal at 153 to enable the charge counter 150 and the discharge counter 152, while the inductor code counter remains disabled. The charge counter 150 is configured to trim the offset voltage source 216 and adjust VIO1 responsive to the comparator output at 138 and a slope clock signal (SLP_CLK). For example, the slope clock signal controls sampling of I_EM and I_SNS. The discharge counter 152 can also be configured to trim the offset voltage source 226 and adjust VIO2 responsive to the comparator output at 138 and a valley clock signal (VAL_CLK). For example, the valley clock signal VAL_CLK controls sampling of I_EM and I_SNS at a time differently than used by the charge counter 150.

Figure 3:
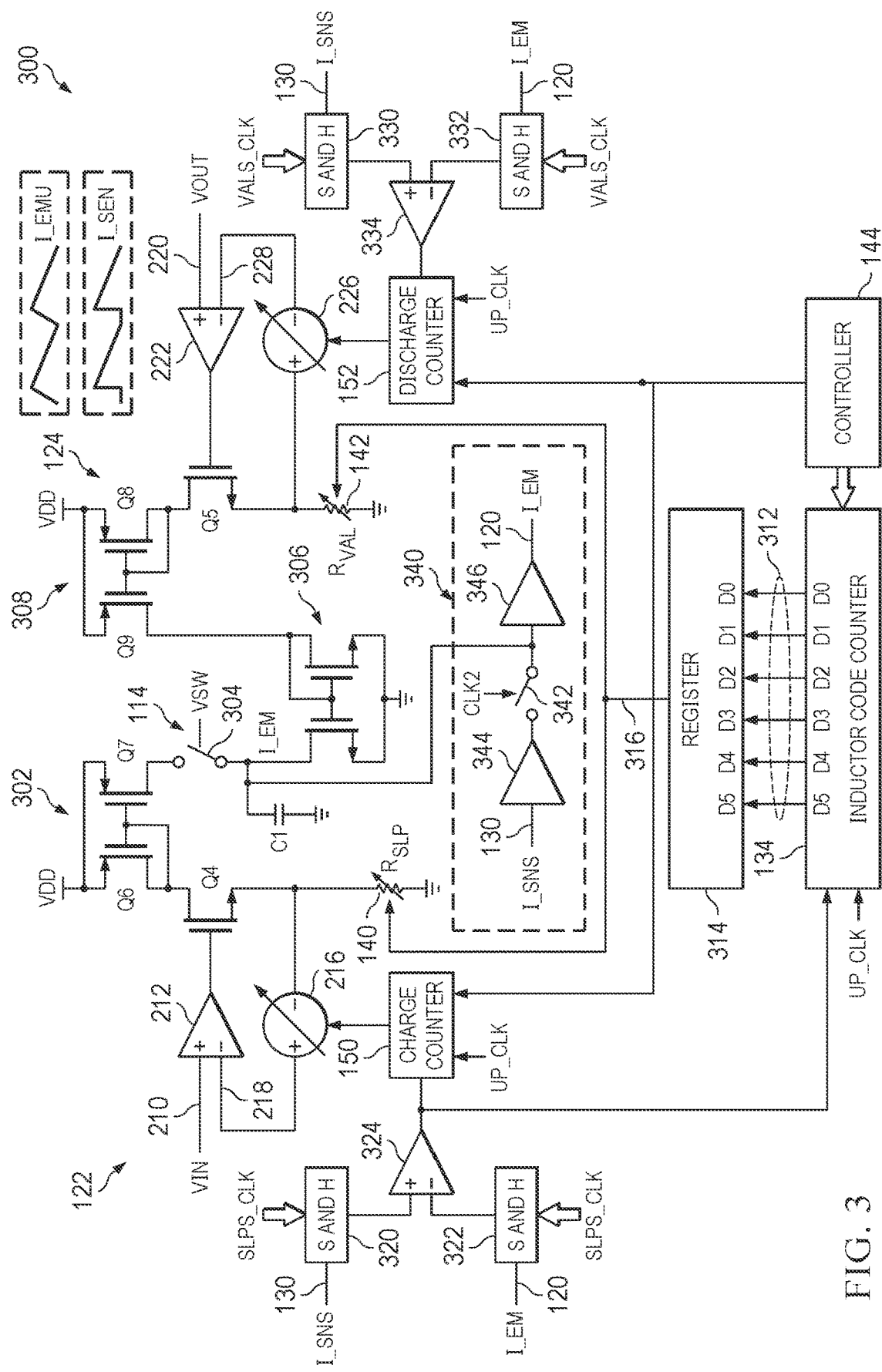
FIG. 3 is a schematic diagram of another example inductance detection circuit.

FIG. 3 illustrates another example of an inductance detection circuit 300. The inductance detection circuit 300 can be used to implement the inductance detection circuit 112 of FIG. 1 or 2. Accordingly, the description of FIG. 3 also refers to FIGS. 1 and 2. For example, the circuit 300 includes an emulated current generator circuit 114, a charge current generator circuit 122 and a discharge current generator circuit 124.

In the example of FIG. 3, the charge current generator circuit 122 includes an amplifier 212 having a non-inverting input 210 configured to receive input voltage VIN (or a voltage derived from VIN). An output of the amplifier 212 has an output coupled to a gate of transistor Q4. A diode connected transistor Q6 is coupled between voltage supply terminal VDD and the drain of Q4. Variable resistor 140 is coupled between the source of Q4 and ground. As described herein, the resistor 140 has a trim input configured to receive the inductor code value from the inductor code counter 134. A variable offset voltage source 216 is coupled between the source of Q4 and the inverting input 218 of the amplifier 212. An output of the charge counter 150 is coupled to the variable offset voltage source 216 and configured to set the voltage VIO1.

The charge current generator circuit 122 is configured to generate the charge current through Q4 and resistor 140 responsive to the amplifier output signal. A current mirror 302, which includes Q6 and another FET Q7, is configured to mirror the generated charge current I_CHARGE from the charge current generator circuit 122 to the emulated current generator 114. For example, an output of the current mirror 302 (e.g., the drain of Q7) is coupled to a first terminal of a switch 304 (e.g., shown as FET Q3 in FIG. 2). The switch 304 has a control input configured to receive switching voltage signal VSW (e.g., at switching output 106). Timing capacitor C1 is coupled between a second terminal of the switch 304 and ground. The second terminal of the switch 304 is coupled to another current mirror 306, which is configured to mirror the discharge current generated by the discharge current generator circuit 124 to another leg of the emulated current generator 114.

The discharge current generator circuit 124 includes amplifier 222 having a non-inverting input 220 configured to receive output voltage VOUT or a voltage derived from VOUT. The amplifier 222 has an output coupled to a gate of Q5. A diode connected transistor Q8 is coupled between voltage supply terminal VDD and the drain of Q5. Variable resistor 142 is coupled between the source of Q5 and ground. The resistor 142 has trim input configured to receive the inductor code value. A variable offset voltage source 226 is coupled between the source of Q5 and the inverting input 228 of the amplifier 222. An output of the discharge counter 152 is coupled to the variable offset voltage source 226 and configured to set the voltage VIO2. The discharge current generator circuit 124 is configured to generate the discharge current through Q5 and resistor 142 responsive to the output signal at the output of amplifier 222. A current mirror 308, which includes Q8 and another FET Q9, is configured to mirror the generated discharge current I_DISCHARGE to current mirror 306 and ultimately to the emulated current generator 114.

In the example of FIG. 3, the inductor code counter 134 has a multi-bit output 312 coupled to a respective multi-bit input of a register 314. The inductor code value can be shifted (e.g., latched) from the counter 134 into the register 314 during a first inductance detection phase. An output 316 of the register 314 (e.g., representative of output 138) provides a multi-bit code to set the resistance of the respective variable resistors 140 and 142. When the first inductance detection phase is completed, such as described herein, the controller 144 can disable the inductor code counter 134, and the last final inductor code can remain stored in the register 304. As a result, the resistance values RSLP and RVAL remain constant during further operation, including a second phase of the inductance detection process. In some examples, the second inductance detection phase is omitted.

To provide a greater amount of precision, the circuit 300 can implement a finer tuning for I_CHARGE and I_DISCHARGE. In the example of FIG. 3, the circuit 300 includes charge-side sample-hold (S/H) circuits 320 and 322. Sample-hold circuit 320 has a sample input coupled to the current sensor output 130 and a clock input configured to receive a slope-sample clock signal (SLPS_CLK). A clock circuit (not shown) can be configured to provide SLPS_CLK to control sampling of I_SNS and I_EM, such as during a charging cycle. Sample-hold circuit 322 has a sample input coupled to the output 120 of the emulated current generator circuit 114 and a clock input configured to receive SLPS_CLK. The circuits 320 and 322 have respective outputs coupled to non-inverting and inverting inputs of comparator 324 (e.g., an error amplifier). The output of comparator 324 is coupled to an input of the charge counter 150 and an input (e.g., input 136) of the inductor code counter 134. Counters 134 and 150 can each have a respective clock input configured to receive an update clock signal (UP_CLK), such as can be generated by an update clock circuit once per PWM cycle. As described herein, however, during the second inductance detection phase, the charge counter 150 can be enabled while the inductor code counter 134 is disabled.

The circuit 300 also includes discharge-side sample-hold (S/H) circuits 330 and 332. Sample-hold circuit 330 has a sample input coupled to the current sensor output 130 and a clock input configured to receive a valley-sample clock signal (VALS_CLK). Sample-hold circuit 332 has a sample input coupled to the output 120 of the emulated current generator circuit 114 and a clock input configured to receive VALS_CLK, such as can be derived from clock signal CLK1 for sampling the current signals I_SNS and I_EM. The circuits 330 and 332 have respective outputs coupled to non-inverting and inverting inputs of comparator 334 (e.g., another error amplifier). The output of comparator 334 is coupled to an input of the discharge counter 152.

The circuit 300 also includes DC reset circuitry 340, which has one input coupled to the output 120 of emulated current generator 114 and another input coupled to current sensor output 130. As an example, the DC reset circuitry 340 includes a switch 342 (e.g., a FET) coupled in series with respective buffers 344 and 346 between outputs 120 and 130. The switch 342 has a control input configured to receive a clock signal (CLK2). The switch 342 is configured to close (e.g., turn on) responsive to CLK2 to couple (e.g., short) the outputs 130 and 120 together. The short through the switch 342 forces signals I_SNS and I_EM to be equal, which resets (e.g., zeroes) accumulated AC error in the signals I_SNS and I_EM. A cycle-by-cycle reset by activating the switch 342 each cycle also helps to track the DC value in the inductor current. In an example, the clock signal CLK2 is asserted to close the switch each cycle with some delay after the low-side switch Q4 (see FIG. 2) is turned on.

Figure 4:
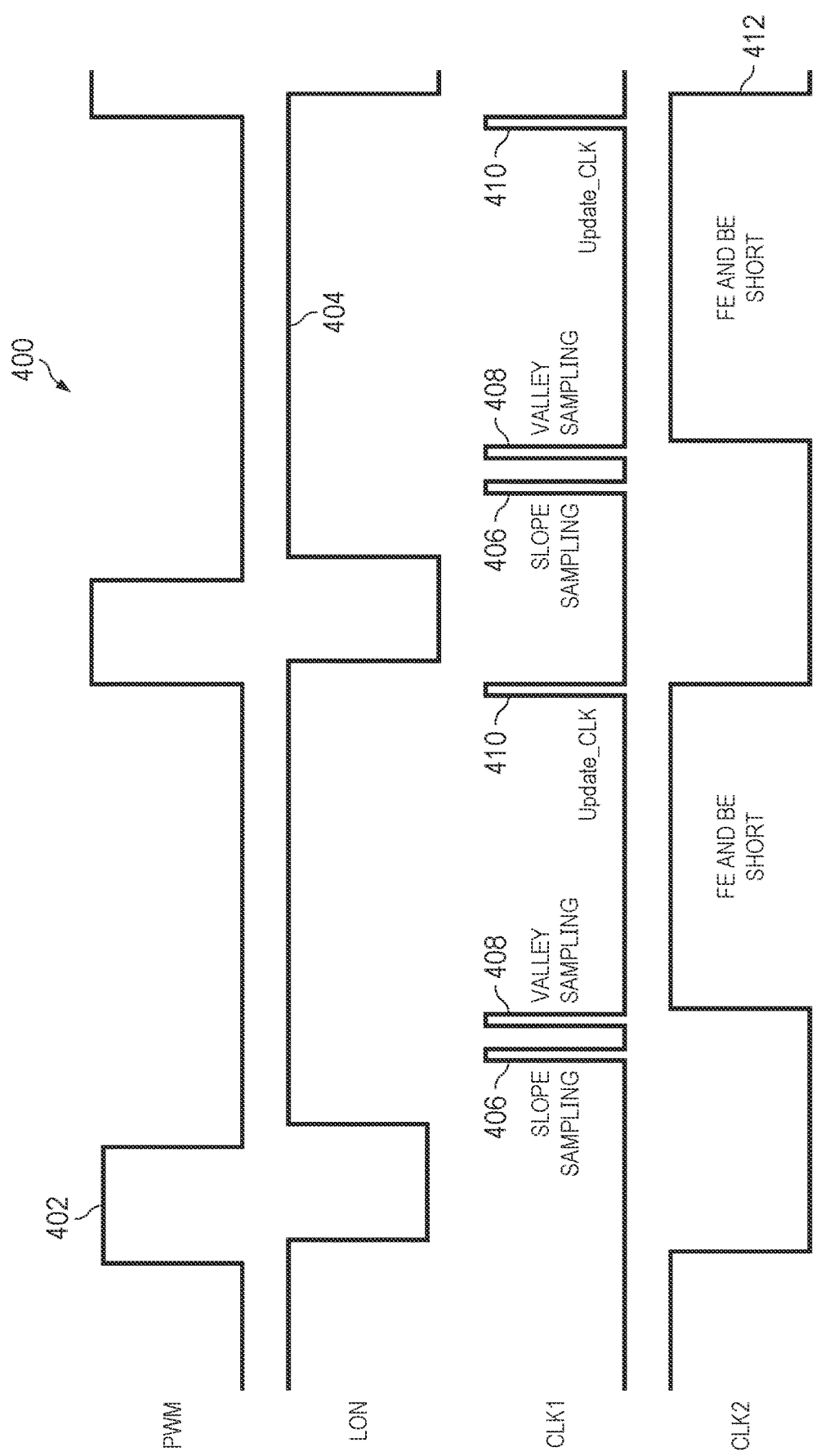
FIG. 4 is a timing diagram showing the inductance detection circuit of FIG. 3.

As a further example, FIG. 4 illustrates a timing diagram 400 for signals used to control the inductance detection circuit 300 of FIG. 3. The timing diagrams shows a PWM signal 402, such as supplied by the control circuit 110. FIG. 4 also shows a low-side on signal 404 and clock signals CLK1 and CLK2. The low-side on signal 404 is representative of activation of low-side FET Q2 in the output stage of the power stage. CLK1 includes a slope sampling clock signal SLPS_CLK 406, valley sampling clock signal VALS_CLK 408 and an update clock signal UP_CLK 410.

As described with respect to FIG. 3, SLPS_CLK 406 is used to control sampling of I_SNS and I_EM by the sample-hold circuits 320 and 322 of the charge generator circuit 122. VALS_CLK is used to control sampling of I_SNS and I_EM by the sample-hold circuits 330 and 332 of the discharge generator circuit 124. The update clock signal UP_CLK is used to control when the counter adjustments are made responsive to the outputs of respective comparators 324 and 334. The second clock signal CLK2 is generated to control the reset circuit 340 each cycle during the inductance detection process, as described herein.

Figure 5:
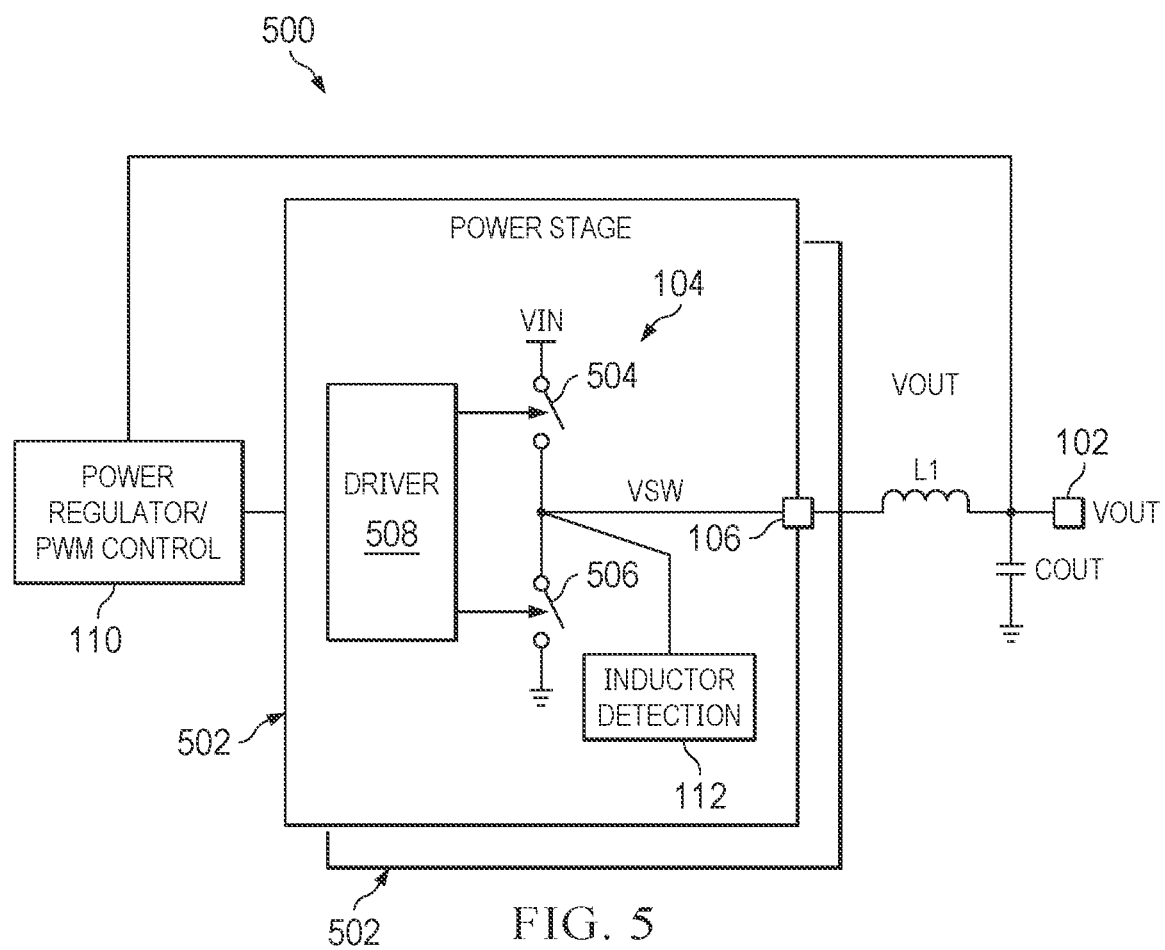
FIG. 5 is a block diagram of an example power converter system.

FIG. 5 illustrates an example power converter system 500 configured to provide a regulated output voltage VOUT at an output 102. The system 500 can implement the inductance detector circuitry 112, as described herein with respect to FIGS. 1-3. Accordingly, the description of FIG. 5 also refers to FIGS. 1-3. The system includes one or more instances of a power stage 502 having a respective switching output 106. Inductor L1 is coupled between the switching output 106 and output 102. The power stage 502 includes an output stage 104 having a high-side switch and a low-side switch coupled between a supply voltage terminal VIN and ground. In the example of FIG. 5, a driver 508 (e.g., a gate driver when switches 504 and 506 are implemented as FETs) has outputs coupled to control inputs of the respective switches 504 and 506. The driver is configured to supply drive signals to turn on and off the switches 504 and 506 responsive to a PWM signal provided by the control circuit 110. For example, the control circuit 110 is configured to implement one or more control loops to regulate the output voltage VOUT to a reference voltage. The power stage 502 is configured to control the output stage 104 responsive to the drive signals to provide the output voltage VOUT.

The power stage 502 can be configured to implement a type of power converter topology (e.g., buck boost, buck-boost, etc.) according to application requirements. In some examples, the power converter system 500 includes multiple power stages 502 configured as a multi-phase power system in which each respective power stage has an inductor coupled to a switching output thereof and the output 102. In a multi-phase power system, each power stage 502 can be configured to implement inductance detection circuitry 112. In one example, the control circuit 110 can be implemented as an IC chip and each power stage 502 can be implemented as a respective IC chip having a switching output terminal (e.g. pin) to which an output inductor is coupled. In another example, the control circuit 110 and power stage(s) can be implemented on a single IC chip.

Figure 6:
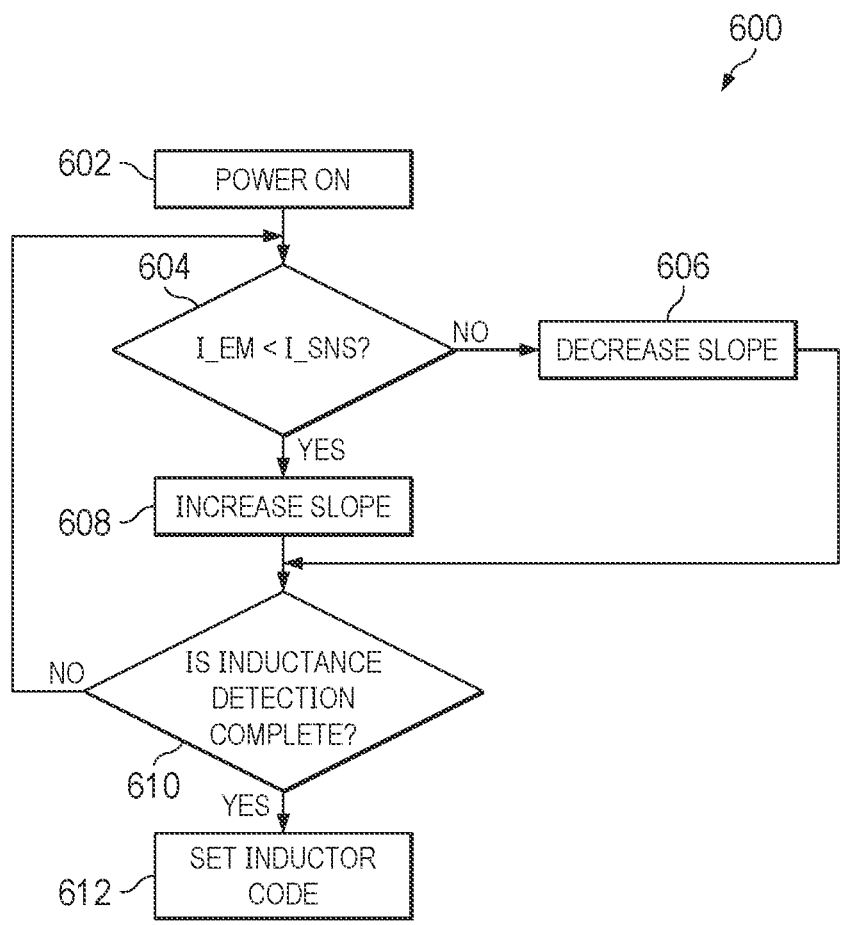
FIG. 6 is a flow diagram showing an example method for detecting inductance.

FIG. 6 is a flow diagram showing an example method 600 for detecting inductance. The method can be implemented by inductance detection circuitry 112 shown in FIGS. 1-3 and 5. Accordingly, the description of FIG. 6 also refers to FIGS. 1-3 and 5. The method 600 begins at 610 at power on of a power converter circuit 100, 200, 300, 500, such as responsive to power being supplied from a battery, an inverter or other power supply. At power up, counters 134, 150 and 152 can be initialized to respective starting values, such as a maximum count value, or a count value between maximum and minimum count values.

At 604, a determination is made whether an emulated inductor current I_EM is greater than a sensed inductor current I_SNS. For example, comparator 116, 324, 334 is configured to provide a comparator output signal based on difference between the emulated inductor current I_EM and the sensed inductor current I_SNS. At 604, if I_EM is less than I_SNS, the method proceeds to 606 to decrease the slope of the emulated current I_EM. For example, the inductor code counter 134 decrements its count value, which causes charge and discharge current generator circuits 122 and 124 to decrease the slope of respective charge and discharge currents I_CHARGE and I_DISCHARGE, so the emulated current generator 114 decreases the slope of I_EM accordingly.

Responsive to detecting I_EM is greater than I_SNS at 604, the method proceeds to 608 to increase the slope of the emulated current I_EM. For example, at 608 the inductor code counter 134 increments its count value, which causes charge and discharge current generator circuits 122 and 124 to increase the slope of respective charge and discharge currents I_CHARGE and I_DISCHARGE. The emulated current generator 114 increase the slope of I_EM accordingly. From 606 or 608, the method 600 proceeds to 610 to determine whether the inductance detection process has completed. For example, the determination at 610 can be based on a number of cycles (e.g., PWM cycles), a fixed period of time, or detecting convergence (e.g., dithering) between I_EM and I_SNS. If the process is not finished, the method returns to 604 for a next cycle. If the process is determined to have completed, the method proceeds from 610 to 612. At 612, an inductor code can be set. For example, the last inductor code value from inductor counter 134 can be stored in memory (e.g., register 314) to fix the slope of the emulated inductor current I_EM. From 612 the method can end or, in some examples, the method 600 can further include a next phase of fine tuning of the emulated inductor current I_EM, such as by tuning adjustable offsets responsive to I_EM and I_SNS, as described herein.

Figure 7:
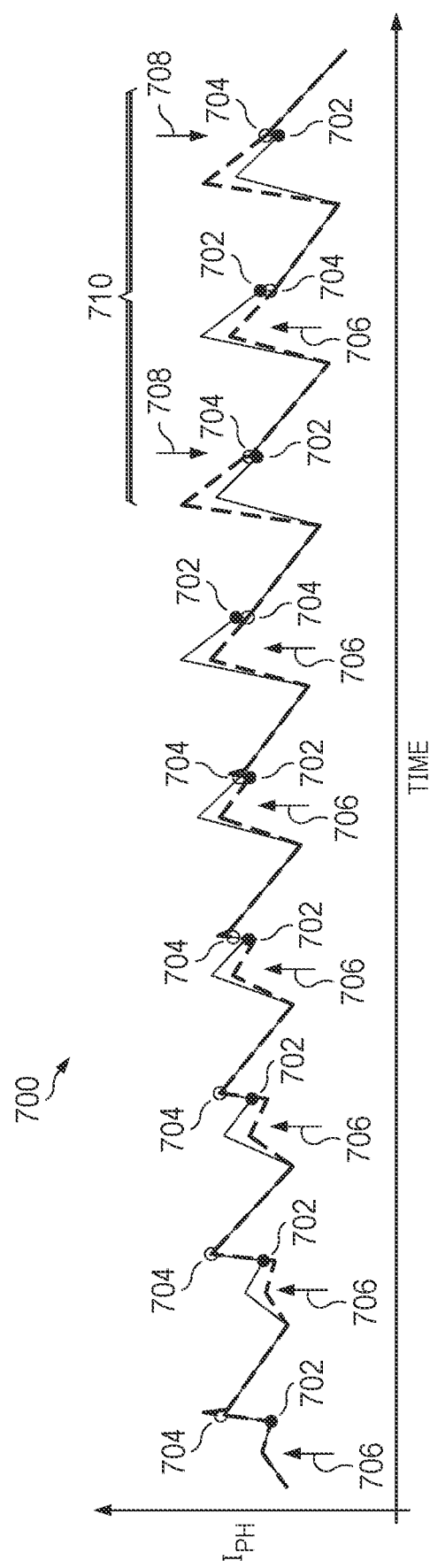
FIG. 7 is a graph of current over time showing how emulated and sensed current change during inductance detection.

FIG. 7 is graph 700 of current over time showing how emulated current I_EM and I_SNS change over time (e.g., cycle-by-cycle) during inductance detection. In the example, of FIG. 7 samples of I_EM and I_SNS are shown respectively as dots 702 and 704 for each cycle. The samples of I_EM and I_SNS can be compared each cycle. For example, the emulated current 702 begins with a shallow slope, such as responsive to initializing the inductor code counter to a maximum count value. The slope of the emulated current signal I_EM can be increased (indicated by up arrows 706) or decreased (indicated by down arrows 708) until the two samples match (e.g., converge to the same value). The sampled values 702 and 704 converge over time, and as shown at 710, after several cycles, the slope of the emulated signal I_EM dithers around an optimal slope. After N cycles where dithering occurs, the inductor code can be stored in memory (where N is a positive integer).

Figure 8:
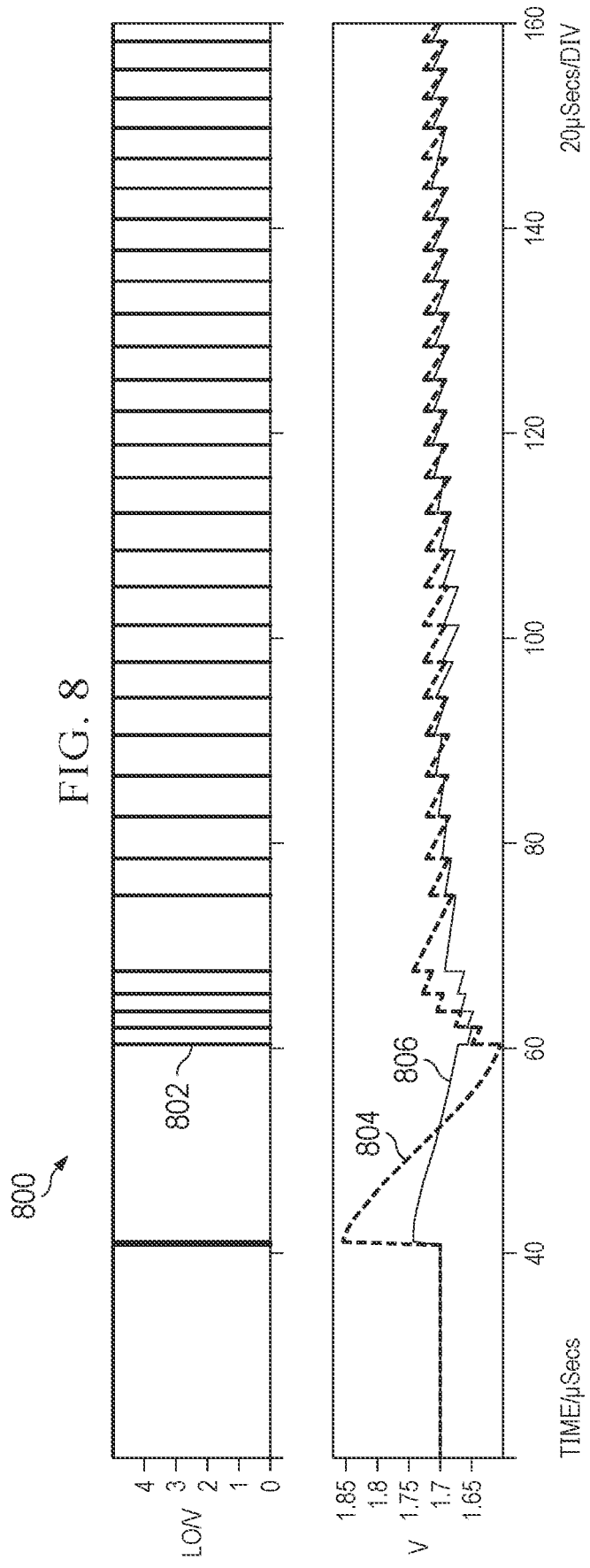
FIG. 8 is a graph of simulation results showing emulated current and sensed current in an example power stage during inductance detection.

FIG. 8 is a graph 800 of simulation results of signals implemented by an inductance detection circuit 112. The graph 800 shows a low-side on signal 802, such as is applied to gate of Q2, or control input of switch 506. The graph 800 also shows emulated current signal 804 and sensed current signal 806 in an example power stage 502 during inductance detection.

Figure 9:
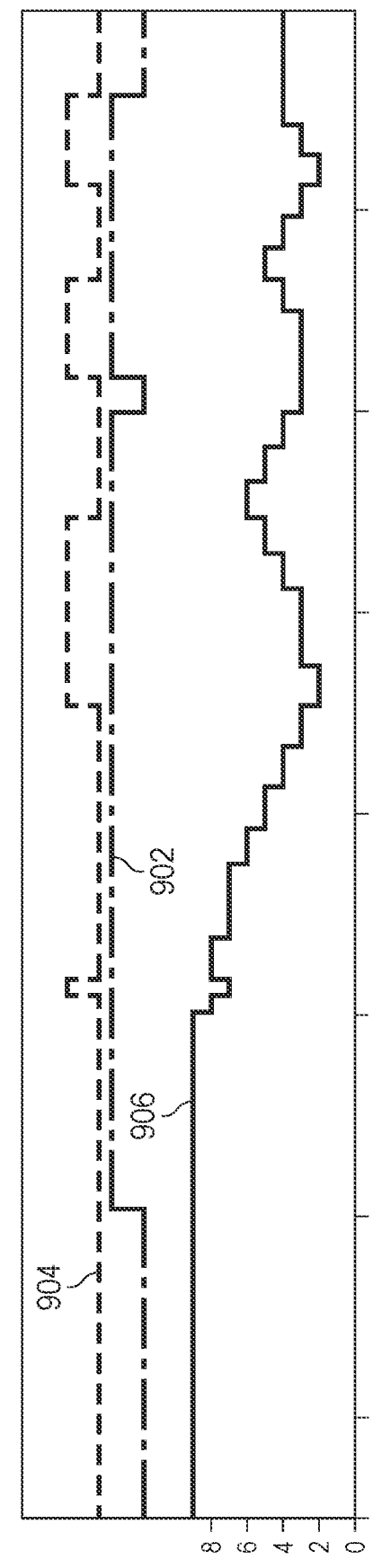
FIG. 9 is another graph of simulation results showing inductor code adjusted together with emulated current and sensed current during inductance detection.
Figure 9:
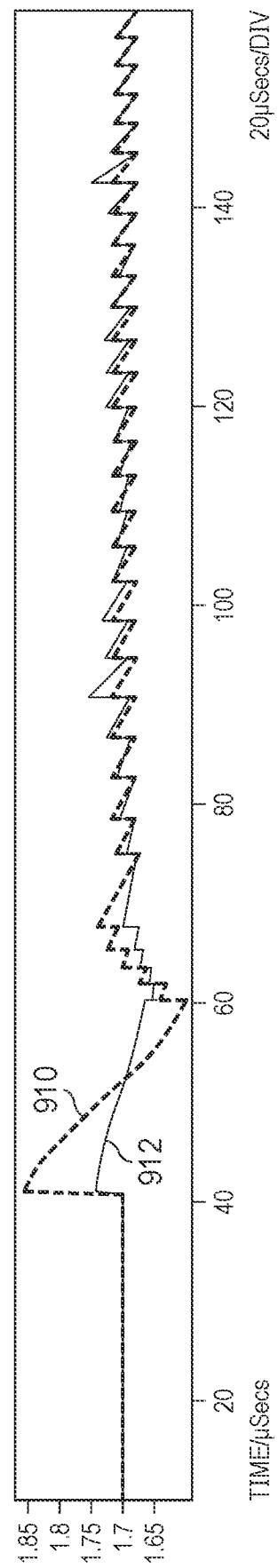

FIG. 9 is another graph 900 of simulation results showing signals implemented by an inductance detection circuit 112. In the example of FIG. 9, an enable signal 902 can be provided by controller 144 to enable inductor code counter 134. A count signal 904 can be provided by a comparator 134 to instruct the inductor code counter 134 to count up or down and provide a multi-bit count value shown at 906. For example, the graph 900 also shows sensed current signal 910 and emulated current signal 912 over a number of cycles during inductance detection. As shown in the graph, the counter signal 906 can be adjusted each cycle responsive to a comparison of emulated current 912 and sensed current 910.

In this description, the term "couple" or "couples" means either an indirect or direct connection. Thus, if a first device couples to a second device, that connection may be through a direct connection or through an indirect connection via other devices and connections. For example, if device A generates a signal to control device B to perform an action, then: (a) in a first example, device A is coupled to device B; or (b) in a second example, device A is coupled to device B through intervening component C if intervening component C does not alter the functional relationship between device A and device B, so device B is controlled by device A via the control signal generated by device A.

The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A circuit comprising:
   an emulated current generator having an output;
   a current sensor having an output;
   a comparator having first and second inputs, and an output, the first input coupled to the output of the emulated current generator, the second comparator input coupled to the output of the current sensor;
   a counter having an input and an output, the input coupled to the output of the comparator;
   a charge circuit having an input coupled to the output of the comparator, the charge circuit comprising a first variable resistor having a trim input coupled to the output of the counter; and
   a discharge circuit having an input coupled to the output of the comparator, the discharge circuit comprising a second variable resistor having a trim input coupled to the output of the comparator.

2. The circuit of claim 1, wherein:
   the emulated current generator is configured to provide an emulated current signal at the output of the emulated current generator representative of an emulated current through an inductor,
   the current sensor is configured to provide a sensed current signal at the output of the current sensor representative of a measure of current through the inductor,
   the comparator is configured to provide a comparator signal at the output of the comparator responsive to the emulated current signal and the sensed current signal,
   the counter is configured to adjust an inductor code value at the output of the counter responsive to the comparator signal, and
   a resistance of the first variable resistor and a resistance of the second variable resistor are set responsive to the inductor code value.

3. The circuit of claim 2, further comprising:
   a controller having an output and an input, the output coupled to an enable input of the counter, the controller configured to provide a control signal at the output to enable the counter responsive to a voltage at the input.

4. The circuit of claim 3, wherein the controller is configured to enable the counter for a duration (i) responsive to a number of cycles of a pulse-width modulation signal or (ii) responsive to a difference between the emulated current signal and the sensed current signal being less than a threshold.

5. The circuit of claim 3, wherein:
   the charge circuit comprises:
      a charge counter having an input and an output, the input coupled to the output of the comparator; and
      a first offset voltage source having a trim input coupled to the output of the charge counter and an output coupled to the first variable resistor; and
   the discharge circuit comprises:
      a discharge counter having an input and an output, the input coupled to the output of the comparator; and
      a second offset voltage source having a trim input coupled to the output of the discharge counter and an output coupled to the second variable resistor.

6. The circuit of claim 5, wherein:
   the charge counter is configured to set a first variable offset voltage for the charge circuit responsive to a signal at the output of the charge counter, and
   the discharge counter is configured to set a second variable offset voltage for the discharge circuit responsive to a signal at the output of the discharge counter.

7. The circuit of claim 5, wherein the output of the controller is a first output, the controller further comprising a second output coupled to respective inputs of the charge counter and the discharge counter.

8. The circuit of claim 7, wherein the controller is configured to enable the counter and disable the charge counter and the discharge counter during a first portion of an inductance detection phase, and to disable the counter and enable the charge counter and the discharge counter during a second portion of the inductance detection phase.

9. The circuit of claim 1, further comprising:
   an output stage comprising:
      a high-side switch coupled between a voltage supply terminal and a switching output terminal; and
      a low-side switch coupled between the switching output terminal and a ground terminal, the current sensor coupled to the low-side switch and configured to provide a sensed current signal representative of current through an inductor coupled to the switching output terminal when the low-side switch is turned on.

10. The circuit of claim 9, wherein the emulated current generator comprises:
    a first current source;
    a third switch having a control input, the third switch coupled in series with the first current source between a first voltage terminal and the output of the emulated current generator;
    a second current source coupled between the output of the emulated current generator and the ground terminal;
    a capacitor coupled between the output of the emulated current generator and the ground terminal; and
    a detector circuit having and output and an input, the input coupled to the switching output terminal, the output coupled to the control input of the third switch, and the detector circuit configured to activate the third switch responsive to a voltage at the switching output terminal.

11. The circuit of claim 9, further comprising:
    an inductor coupled to the switching output terminal;
    a gate driver having a pulse width modulation (PWM) input and driver outputs, the driver outputs coupled to respective control inputs of the respective low-side and high-side switches; and
    a power control circuit having a PWM output coupled to the PWM input, the power control circuit configured to provide a PWM control signal to the gate driver to provide a regulated voltage at VOUT.

12. The circuit of claim 11, further comprising a reset circuitry coupled between the output of the emulated current generator and the output of the current sensor, the reset circuitry configured to connect the output of the emulated current generator and the output of the current sensor responsive to a clock signal.

13. The circuit of claim 1, wherein the emulated current generator, the current sensor, the comparator, the counter, the charge circuit and the discharge circuit are implemented on a semiconductor substrate of an integrated circuit.

14. A circuit comprising:
an emulated current generator configured to provide an emulated current signal responsive to a charge current and a discharge current respectively charging or discharging a capacitor, the emulated current signal representative of an emulated current through an output inductor, the emulated current generator comprising a switching voltage detector;
a comparator configured to provide a comparator signal responsive to the emulated current signal and a sensed current signal representative of a measure of current through the output inductor; and
an inductor code counter configured to adjust an inductor code count value responsive to the comparator signal, wherein a slope of the emulated current signal is adjusted responsive to the inductor code count value.

15. The circuit of claim 14, further comprising:
a charge current generator circuit comprising a first variable resistor having a resistance set responsive to the inductor code count value, the charge current generator circuit configured to provide the charge current having a value responsive to the resistance of the first variable resistor; and
a discharge current generator circuit comprising a second variable resistor having a resistance set responsive to the inductor code count value, the discharge current generator circuit configured to provide the discharge current having a value responsive to the resistance of the second variable resistor.

16. The circuit of claim 15, further comprising a controller configured to provide a control signal to enable the inductor code counter responsive to a voltage at a power supply terminal.

17. The circuit of claim 16, wherein the controller is configured to enable the inductor code counter in an inductance detection phase having a duration that is at least one of (i) responsive to a number of cycles of a pulse-width modulation signal, or (ii) responsive to a difference between the emulated current signal and the sensed current signal being less than a threshold.

18. The circuit of claim 16, wherein:
the charge current generator circuit includes a first variable offset voltage source and a charge counter, the charge counter configured to set a voltage of the first variable offset voltage source responsive to a first sample of the emulated current and the sensed current, and
the discharge current generator circuit includes a second variable offset voltage source and a discharge counter, the discharge counter configured to set a voltage of the second variable offset voltage source responsive to a second sample of the emulated current and the sensed current.

19. The circuit of claim 18, wherein the controller is configured to enable the inductor code counter and disable the charge counter and the discharge counter during a first portion of an inductance detection phase, and to disable the inductor code counter and enable the charge counter and the discharge counter during a second portion of the inductance detection phase.

20. The circuit of claim 19, further comprising reset circuitry configured to short the emulated current signal and the sensed current signal together for a portion of time per cycle of the inductance detection phase.

21. The circuit of claim 14, further comprising:
an output stage comprising:
a high-side switch coupled between a voltage supply terminal and a switching output terminal;
a low-side switch coupled between the switching output terminal and a ground terminal;
the output inductor coupled to the switching output terminal;
a driver configured to control the high-side and low-side switches responsive to a pulse-width modulated control signal; and
a current sensor coupled to the low-side switch and configured to provide the sensed current signal representative of the measure of current through the output inductor when the low-side switch is turned on.

22. The circuit of claim 21, wherein the emulated current generator comprises:
a first current source configured to provide the charge current;
a second current source coupled to a current output of the emulated current generator, the second current source configured to provide the discharge current;
a switch coupled between the first and second current sources and configured to connect the first current source with the current output;
a capacitor coupled between the current output and the ground terminal; and
a detector circuit configured to activate the switch so the emulated current is provided responsive to a switching voltage at the switching output terminal.

23. A system comprising:
an inductor; and
a power stage comprising:
a first switch coupled to the inductor;
a second switch coupled to the first switch and to the inductor;
a driver configured to control the first switch and the second switch responsive to a pulse-width modulated control signal; and
inductance detection circuitry comprising:
an emulated current generator having an output;
a comparator having first and second inputs, and an output, the first input coupled to the output of the emulated current generator, and the second input is configured to receive a measure of current through the inductor;
a counter having an input and an output, the input coupled to the output of the comparator;
a charge circuit having an input coupled to the output of the comparator, the charge circuit comprising a first variable resistor having a trim input coupled to the output of the counter; and
a discharge circuit having an input coupled to the output of the comparator, the discharge circuit comprising a second variable resistor having a trim input coupled to the output of the counter.

24. The system of claim 23, further comprising:
a current sensor configured to provide a sensed current signal representative of the measure of current through the inductor, the emulated current generator is configured to provide an emulated current signal at the output representative of an emulated current through the inductor, wherein:

the comparator is configured to provide a comparator signal at the output responsive to the emulated current signal and the sensed current signal, the counter is configured to adjust an inductor code value at the output responsive to the comparator signal, and a resistance of the first variable resistor and a resistance of the second variable resistor are set responsive to the inductor code value.

\* \* \* \* \*